United States Patent [19]

Holloway

[11] 4,415,531
[45] Nov. 15, 1983

[54] SEMICONDUCTOR MATERIALS

[75] Inventor: Henry Holloway, Ann Arbor, Mich.

[73] Assignee: Ford Motor Company, Dearborn, Mich.

[21] Appl. No.: 392,190

[22] Filed: Jun. 25, 1982

[51] Int. Cl.³ .............................................. C01C 15/00
[52] U.S. Cl. .................................... 420/564; 420/903
[58] Field of Search .............. 420/580, 903, 564, 563, 420/415; 252/62.3 V, 62.35, 501.1; 423/511

[56] References Cited

U.S. PATENT DOCUMENTS

| | | | |
|---|---|---|---|
| 2,742,550 | 4/1956 | Jenness, Jr. ............................ | 201/63 |
| 3,070,467 | 12/1962 | Fuller et al. ........................... | 148/1.5 |
| 3,110,685 | 11/1963 | Offergeld ............................. | 252/512 |
| 3,403,133 | 9/1968 | Fredrick et al. ....................... | 420/903 |
| 3,447,097 | 5/1969 | Kiss ..................................... | 331/94.5 |
| 3,574,140 | 4/1971 | Schoolar et al. ....................... | 252/501 |
| 3,595,690 | 7/1971 | Cooperstein ......................... | 117/211 |
| 3,623,907 | 11/1971 | Watts ................................... | 117/224 |
| 3,716,424 | 2/1973 | Schoolar .............................. | 148/175 |
| 3,940,472 | 2/1976 | Donohue .............................. | 423/511 |
| 4,143,207 | 3/1979 | Itakura et al. ......................... | 428/539 |
| 4,192,721 | 3/1980 | Fawcett et al. ........................ | 204/14 N |
| 4,238,232 | 12/1980 | Minomura ............................. | 420/903 |

OTHER PUBLICATIONS

Holloway et al., "Lead Stronium and Lead Calcium Sulfide, Two New Alloy Semiconductors", *American Physical Society*, pp. 5617–5622, 7/12/82.

Primary Examiner—L. Dewayne Rutledge
Assistant Examiner—S. Kastler
Attorney, Agent, or Firm—Paul K. Godwin, Jr.; Robert D. Sanborn

[57] ABSTRACT

A novel pseudobinary alloy of $Pb_{1-x}M_xS$, wherein $0 < x < 1$ and M is selected from the group consisting of Sr and Ca, exists as a single phase at all compositions. With change in composition of $Pb_{1-x}Sr_xS$, the energy gap at 300K has been found to change continuously from 0.4 eV for PbS to 4.6 eV for SrS. For compositions with $x \leq 0.2$, p-type and n-type thin films have been prepared by doping with Tl or Ag and with Bi, respectively. Similar single phase behavior and composition dependence of the energy gap is found with $Pb_{1-x}Ca_xS$.

3 Claims, 5 Drawing Figures

SEMICONDUCTOR MATERIALS

FIELD OF THE INVENTION

The present invention relates to the field of semiconductor materials and more specifically to the area of pseudobinary alloys having properties that are continuously variable throughout the composition range.

SUMMARY OF THE INVENTION

A novel semiconductor alloy is disclosed which has the chemical composition of $Pb_{1-x}M_xS$, wherein x is greater than 0 and less than 1 and M is selected from the group of elements consisting of Sr and Ca.

Samples of the alloy have been formed in layers by simultaneous vacuum deposition of the constitutent source materials onto substrate surfaces. The samples were formed over the range of x and then tested. It was found that the lattice constant property varies continuously and monotonically with composition and that the alloy exists as a single phase cubic crystalline form with compositions throughout the range of x.

Measurements of the optical absorption edge in individual samples of the alloy show that the edge moves continuously as the composition is changed over the range of x. In addition, the direct energy gaps for the alloy show continuous variation throughout the range of x.

It is therefore, an object of the present invention to provide a semiconductor alloy material having a chemical formula $Pb_{1-x}M_xS$ wherein M is selected from the group consisting of Sr and Ca.

It is another object of the present invention to provide the aforementioned semiconductor material wherein x may be varied from 0 to 1.

It is a further object of the present invention to provide a semiconductor alloy material wherein the alloy remains in a single phase over the entire range of x.

It is a still further object of the present invention to provide a semiconductor material in which the energy gap value may be selected from a continuous range of values throughout the range of x.

DESCRIPTION OF THE PREFERRED EMBODIMENTS

The formation of the novel psuedobinary $Pb_{1-x}M_xS$ alloy may be achieved by selecting the appropriate source materials Pb, S and one of the elements selected from the group consisting of Sr and Ca. By effusion of the source materials, layers of the alloy may be deposited onto a substrate surface.

During development of this alloy, several samples were formed at various constituent properties over the range of x and their properties were compared.

For instance, layers of $Pb_{1-x}M_xS$ with thicknesses in the range 1.0–1.5 $\mu$m were grown by vacuum deposition onto heated cleaved single crystals of $BaF_2$. (This cleavage produces a (111) face.) Typical growth rates were about 0.5 $\mu$m/h. Most of the sample depositions were performed with substrates at 300° C. A few that were performed with substrates at 400° C., wherein x=0.1–0.2, gave essentially similar characteristics as those at 300° C. The depositions were made from graphite effusion cells that contained sources of PbS (an alternative to using pure Pb), Sr, and S in a vacuum chamber at a partial pressure of approximately $10^{-7}$ torr. The PbS and Sr sources were operated at temperatures in the range 500°–700° C. that would give the required ratio of Pb and Sr fluxes. For consistent rates from the Sr source, it was found helpful to preheat the source to about 720° C. for 0.5 h before lowering the temperature to that used for deposition. The S source temperature of about 180° C. was adjusted to give a flux that was a factor of four to ten greater than that calculated for complete reaction with the Sr. The Pb and S were of nominal six nines and five nines purity respectively. The Sr was a commercial grade with a nominal purity of only 99.7%, although the sublimation during use of the source would be expected to give a significant but unestimated degree of further purification. Layers of $Pb_{1-x}Ca_xS$ alloy samples were grown by the same method with substitution of Ca for Sr source material.

The layers were examined with an X-ray diffractometer using a $\theta/2\theta$ scan. This gives information only about the lattice planes that are parallel to the substrate surface.

Figure 1:
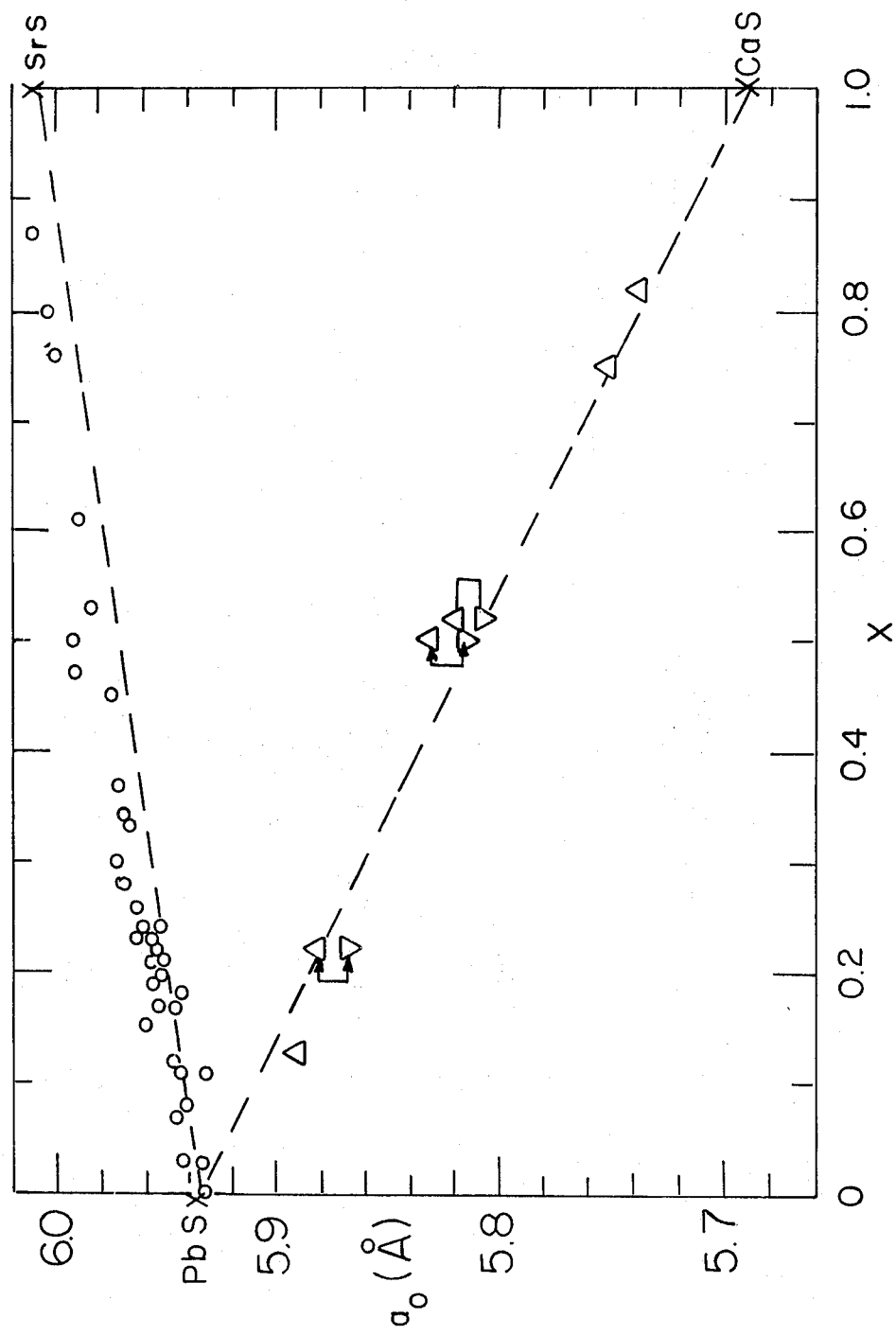
FIG. 1 is a plot of lattice constants for the $Pb_{1-x}Sr_xS$ and $Pb_{1-x}Ca_xS$ samples of the alloy over the range of x.

$Pb_{1-x}Sr_xS$ layers with compositions that spanned the range of x from PbS to SrS gave diffraction patterns that showed only (111) planes parallel to the substrate surface. Measurements of the lattice constant using the [444] peaks with the $BaF_2$ substrate as an internal standard gave the results that are shown in FIG. 1. Within some experimental uncertainty, the lattice constant varies continuously and monotonically with composition. The data suggest a small positive deviation from Vegard behavior.

FIG. 1 also shows the results of a smaller number of measurements of $Pb_{1-x}Ca_xS$ layers. Here again, the lattice constant varies smoothly with the composition and the pseudobinary alloy is shown to exist as a single phase at compositions throughout the range.

One significant difference with $Pb_{1-x}Ca_xS$ was that the (hhh) diffraction peaks were split when the composition was in the range x=0.2–0.5. This gave rise to the pairs of points that are linked in FIG. 1. The splittings were distinctly different from the results that would be expected from a separation into two phases due to limited mutual solubility of the components. Thus, the ratio of the intensities of the two peaks did not change significantly with change in layer composition, but the position of the split peak did change with composition. The results suggest only a slight deviation from cubic symmetry. While the data are insufficient for a firm conclusion, it is worth noting that with a trigonal distortion of the rocksalt unit cell the observed splittings could arise from a rhombohedral angle that differs by only 0.1° from the cubic value of 90°.

Transmission measurements of $Pb_{1-x}Sr_xS$ films at 300K showed that the optical absorption edge moved continuously as the composition was changed from PbS to SrS. In the region of the edge there was a linear relationship between the photon energy and the square of the absorbance. This is indicative of a direct energy gap. For photon energies that were 0.1–0.3 eV greater than the extrapolated cutoff, the absorption coefficients were in the range $10^4$–$10^5$ cm$^{-1}$. This result is also consistent with a direct gap.

Figure 2:
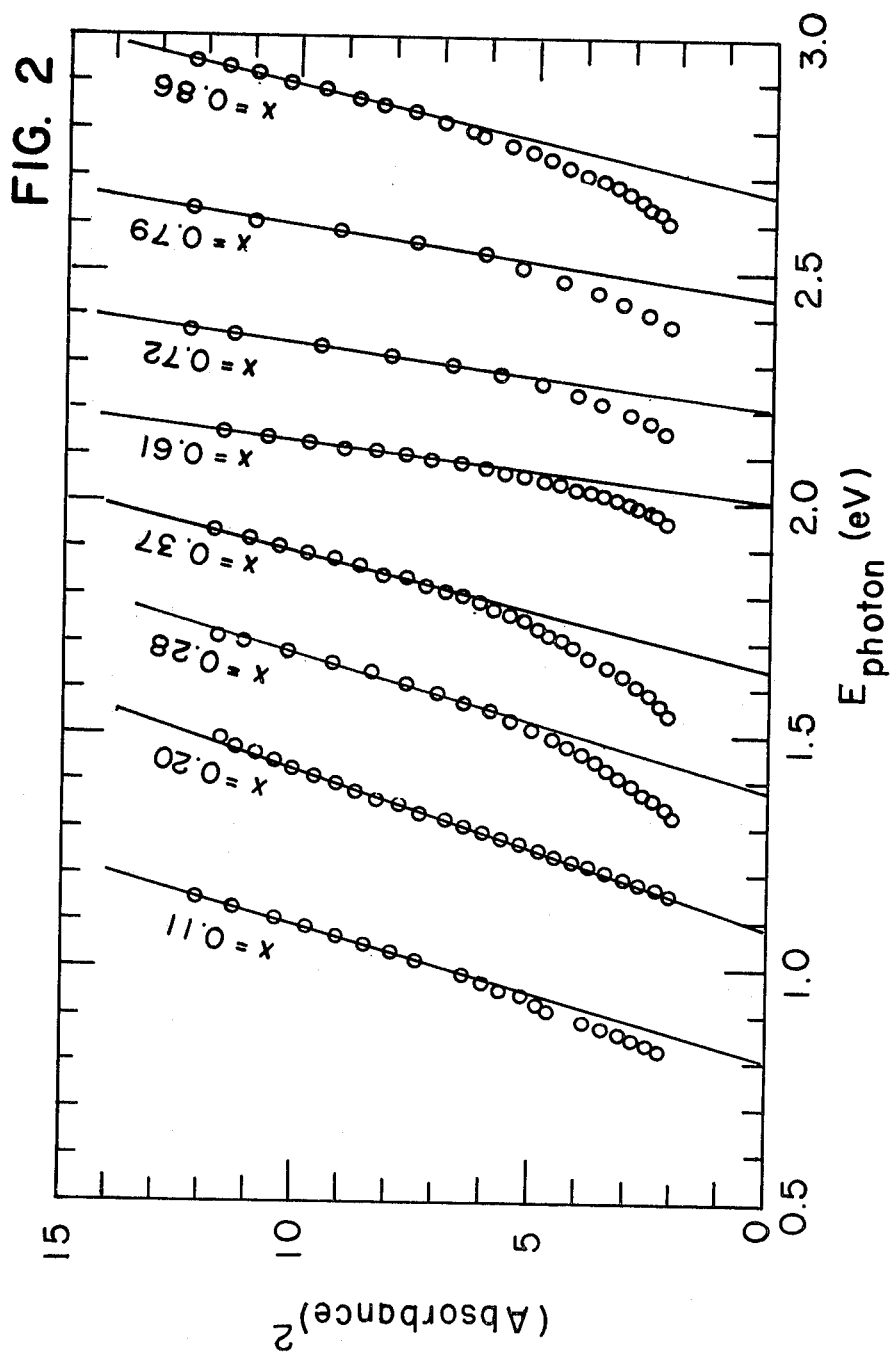
FIG. 2 is a plot of absorption edges for various samples of $Pb_{1-x}Sr_xS$ samples.

FIG. 2 shows some absorption edge data that are typical of the results obtained with $Pb_{1-x}Sr_xS$ (with one exception that is described later). These plots of the square of the absorbance against photon energy have linear regions that were extrapolated to obtain the direct gap. In most cases, the plots also showed tails at the low absorption end. The tails extend over 0.1–0.2 eV and they may be attributed to compositional inhomogeneities that arise from less than perfect control of the source temperatures and hence of the ratio of the PbS and Sr fluxes. (With typical temperature various of ±0.5° C. during film growth the change in x would be on the order of ±5%. For x=0.2 this would correspond to a variation of ±0.05 eV in energy gap.) In a few cases, exceptional stability of the source temperatures led to greatly reduced tails.

The only exception to the simple edge structure that is described above was observed with speciments that had x=0.95. Here the edge with extrapolated cutoff at 3.68±0.01 eV was accompanied by absorption maxima at 3.47±0.01 eV and 3.22±0.01 eV. The structure was observed with specimens that had been grown in different experiments, but its origin has not yet been found.

Figure 3:
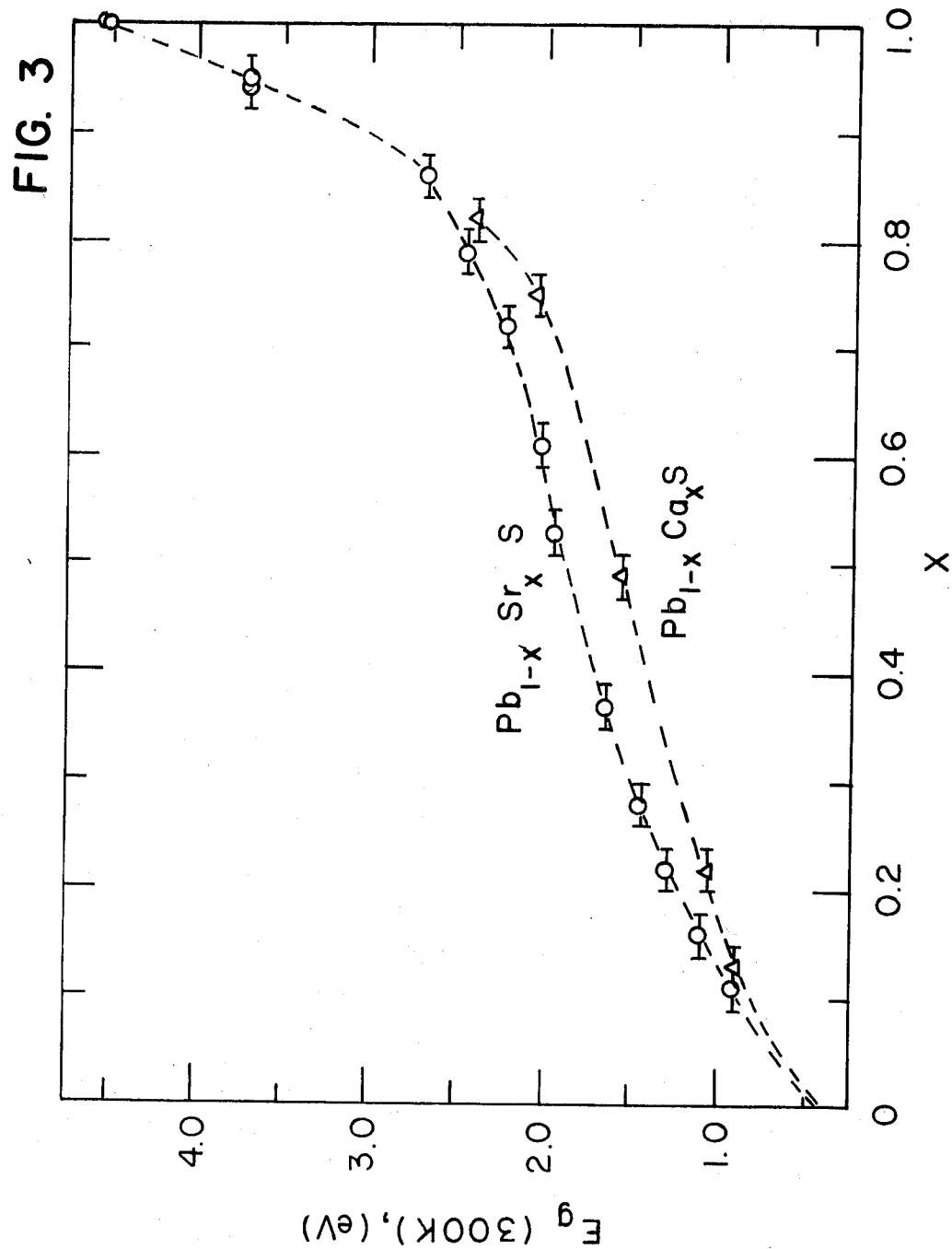
FIG. 3 is a plot showing the relationship of the direct energy gaps for the alloys $Pb_{1-x}Sr_xS$ and $Pb_{1-x}Ca_xS$ samples of the alloy over the range of x.

The composition dependences of the direct energy gaps of $Pb_{1-x}Sr_xS$ and $Pb_{1-x}Ca_xS$ are shown in FIG. 3. The data of $Pb_{1-x}Sr_xS$ show a continuous variation of $E_g$. Incorporation of Sr on the order of 0.05 or greater increases the energy gap by an amount that leads to a significant change in the semiconducting properties from those of pure PbS. The results for $Pb_{1-x}Ca_xS$ are similarly continuous, although lower for the range of x=0–0.82.

Measurements of doped layers were made with $Pb_{1-x}Sr_xS$ that had x≦0.2 ($E_g$≦1.3 eV). In the absence of deliberate doping, layers with x=0.2 had resistivities near $10^3$ ohmcm at 300K. This was outside the range that permitted reliable Hall measurements with the equipment that was used.

Figure 4:
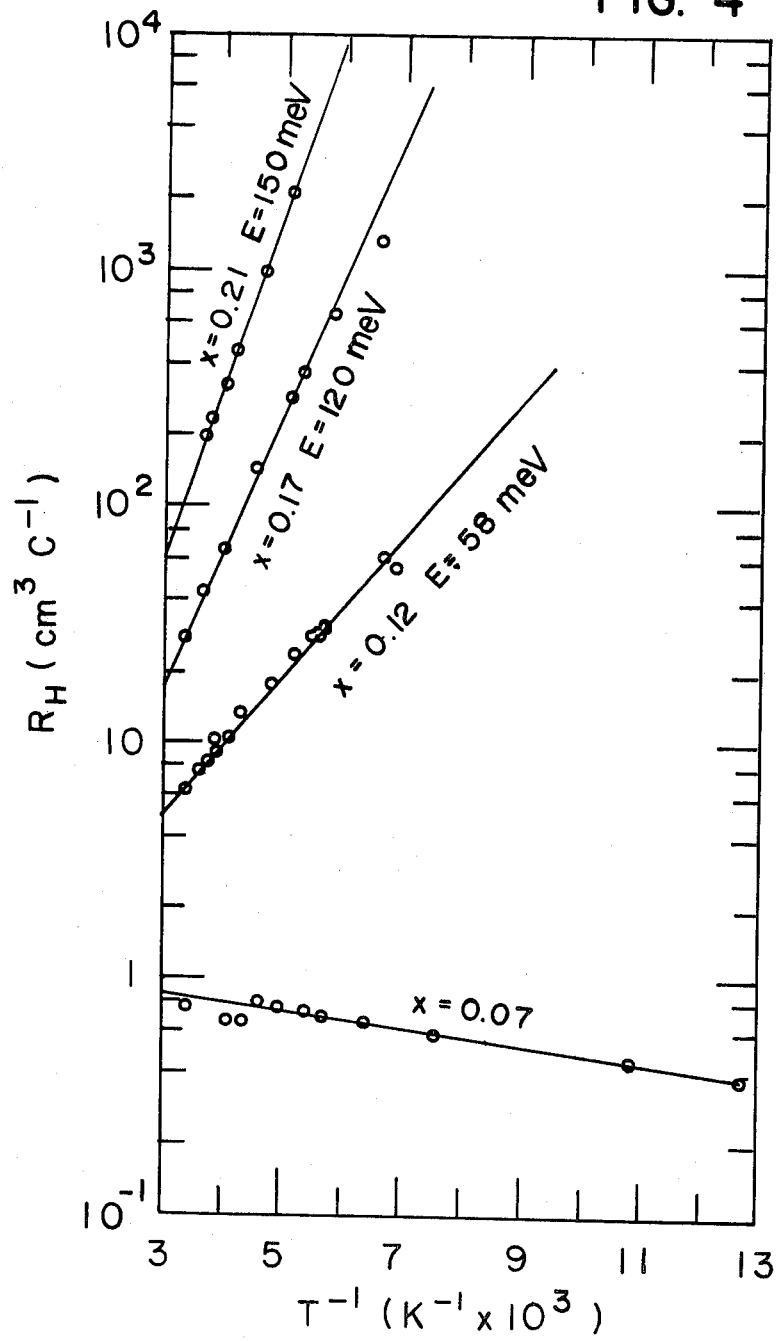
FIG. 4 is a plot of the temperature dependencies of the Hall coefficients of Tl-doped $Pb_{1-x}Sr_xS$ layers.

With incorporation of Tl during growth p-type layers were obtained with x=0.2 and with 300K resistivities reduced to 1–10 ohmcm. FIG. 4 shows the temperature dependent of the Hall coefficients of a series of Tl-doped $Pb_{1-x}Sr_xS$ layers that had different values of x. These specimens were prepared with the same growth rate and the same flux of Tl dopant. It is evident that with an increase in the Sr content there is a rapid increase in the activation energy for acceptor ionization and a concomitant decrease in the number of acceptors that are ionized at 300K. (The apparent small negative activation energy for the specimen with x=0.07 is probably a consequence of temperature dependent degeneracy at this rather large hole concentration of about $10^{19}$ cm$^{-3}$.)

Figure 5:
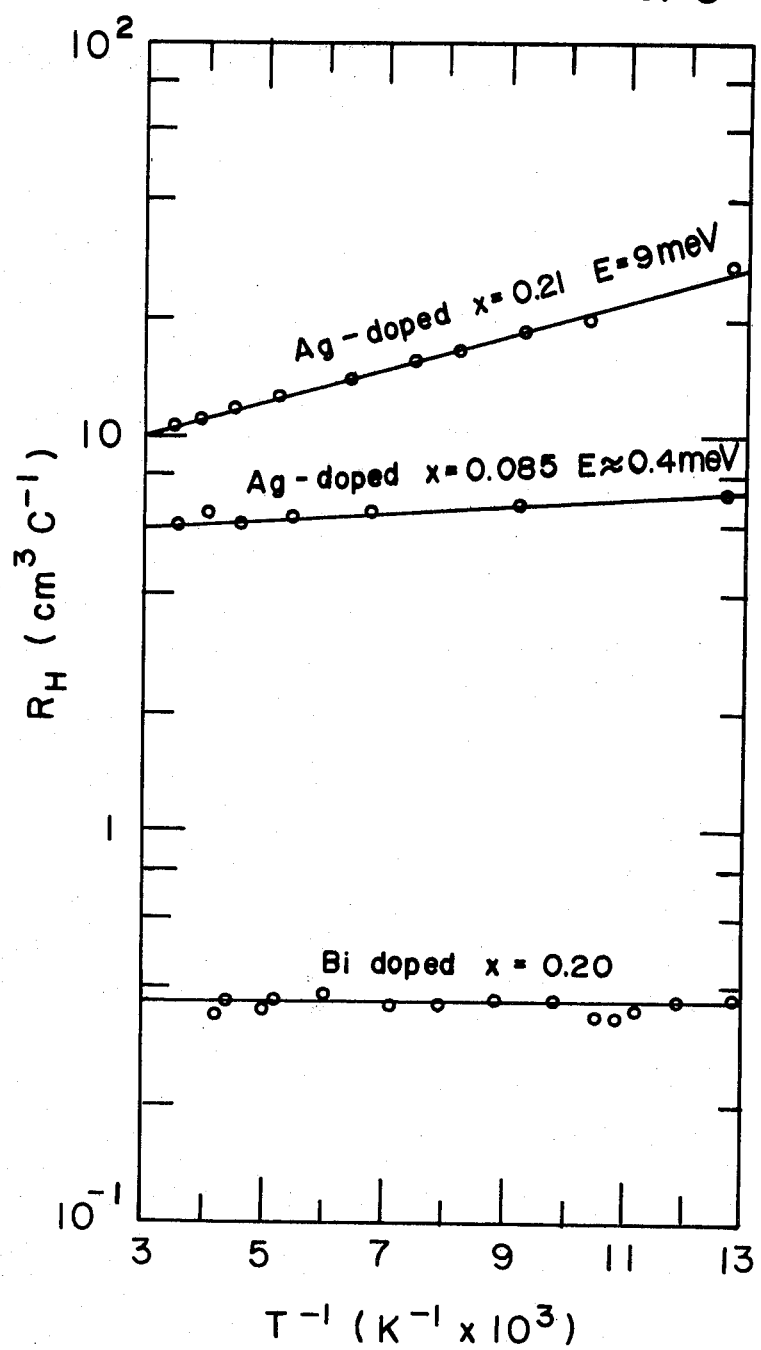
FIG. 5 is a plot of the temperature dependencies of the Hall coefficients of Ag-doped and Bi-doped $Pb_{1-x}Sr_xS$ layers.

Replacement of the Tl dopant with Ag gave p-typelayers that exhibited greatly reduced freezeout. At x=0.21 the activation energy for acceptor ionization was reduced from 150 meV to 9 meV. FIG. 5 shows the temperature dependent Hall coefficients of two doped layers that had approximately equal Ag concentrations with x=0.085 and 0.21, respectively.

N-type layers were prepared by incorporation of Bi during growth. In this case, as shown in FIG. 5, there was no significant freezeout with x=0.2 at temperatures down to 80K.

The carrier mobilities in $Pb_{1-x}Sr_xS$ decrease with increasing Sr content. For compositions near x=0.2 the electron and hole mobilities were found to be about 20 cm$^2$V$^{-1}$s$^{-1}$ at 300K and were not strongly temperature dependant. (For comparison, typical electron and hole mobilities in single crystal PbS at 300K are phonon limited at about 400 cm$^2$V$^{-1}$s$^{-1}$ with a T$^{-5/2}$ dependence.)

These results show that the pseudobinary alloy $Pb_{1-x}Sr_xS$ exists as a single phase for all values of the x range. The direct energy gap of $Pb_{1-x}Sr_xS$ may be chosen to be anywhere in the range of 0.4–4.6 eV by appropriate choice of the composition. The resulting range of the cutoff wavelength from the IR to the near UV appears to be unique among the known alloy semiconductors.

Doping experiments show that $Pb_{1-x}Sr_xS$ may be made either p-type or n-type for at least the range x≦0.2. This opens up the possibility that useful p-n junction devices might be made with this material. In addition, the ability to grow thin films could offer a low cost technology for solar cells. In this context, it is necessary to consider the reactivity of the layers. Here the potential problem is hydrolysis of SrS by atmospheric water to give SrO and H$_2$S. Pure SrS layers were observed to degrade visibly in humid atmospheres over periods of the order of months. However, layers of the novel alloy with x≦0.3 have been exposed briefly to liquid water without noticeable degradation in the course of photolithographic processing. This observation suggests that layers with x≦0.2 are unreactive enough to permit conventional p-n junction technology, although the subsequent addition of an encapsulating layer would probably be essential.

The stability and the behavior of the energy gap of $Pb_{1-x}Ca_xS$ appear to be broadly similar to those of $Pb_{1-x}Sr_xS$, although the range of compositions with x>0.8 could bear further study. With this material, some cracking was observed in the films when they were cooled to ambient. Such cracking may make them less attractive for practical thin film applications. While the cause of the cracking has not been determined one might speculate that it is related to the observed splitting of the x-ray diffraction peaks. By analogy with $Pb_{1-x}Ge_xTe$, the cubic phase might be expected to be stable at higher temperatures. A loss of cubic symmetry on cooling to ambient temperature could lead to crystal damage due to incommensurate distortion of differently oriented regions.

I claim:

1. A semiconductor alloy having the chemical formula $Pb_{1-x}M_xS$, wherein the value of x is greater than 0 and less than 1 and M is selected from the group of elements consisting of Sr and Ca.

2. A semiconductor alloy as in claim 1, wherein said chemical formula is $Pb_{1-x}Sr_xS$ and said x is in the range of between 0.005 and 0.8.

3. A semiconductor alloy as in claim 1, wherein said chemical formula is $Pb_{1-x}Ca_xS$ and said x is in the range of between 0.05 and 0.8.

* * * * *